United States Patent
Sakaue et al.

(10) Patent No.: US 8,782,496 B2
(45) Date of Patent: Jul. 15, 2014

(54) MEMORY CONTROLLER, SEMICONDUCTOR MEMORY APPARATUS AND DECODING METHOD

(75) Inventors: Kenji Sakaue, Kanagawa (JP); Atsushi Takayama, Kanagawa (JP); Yoshihisa Kondo, Kanagawa (JP); Tatsuyuki Ishikawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 473 days.

(21) Appl. No.: 13/235,395

(22) Filed: Sep. 18, 2011

(65) Prior Publication Data
US 2012/0297273 A1 Nov. 22, 2012

(30) Foreign Application Priority Data

May 17, 2011 (JP) .................................. 2011-110719

(51) Int. Cl.
*G11C 29/00* (2006.01)
*H03M 13/00* (2006.01)
*H03M 13/11* (2006.01)
*H03M 13/45* (2006.01)
*G06F 11/10* (2006.01)

(52) U.S. Cl.
CPC ........... *H03M 13/1105* (2013.01); *G11C 29/00* (2013.01); *H03M 13/45* (2013.01); *G06F 11/1068* (2013.01); *H03M 13/1111* (2013.01)
USPC .......................................... 714/773; 714/780

(58) Field of Classification Search
CPC ..................... H03M 13/1105; H03M 13/1111; H03M 13/45; G06F 11/1068; G11C 29/00
USPC .............................................. 714/773, 780
See application file for complete search history.

(56) References Cited

U.S. PATENT DOCUMENTS

| 7,120,856 | B2 * | 10/2006 | Zhang et al. .................. 714/801 |
| 7,178,080 | B2 * | 2/2007 | Hocevar ........................ 714/752 |
| 7,184,486 | B1 * | 2/2007 | Wu et al. ....................... 375/262 |
| 7,966,544 | B2 * | 6/2011 | Paumier et al. ............... 714/755 |
| 2007/0089016 | A1 * | 4/2007 | Bhatt et al. ..................... 714/752 |
| 2007/0089017 | A1 * | 4/2007 | Tang et al. ..................... 714/752 |
| 2008/0077843 | A1 * | 3/2008 | Cho et al. ....................... 714/801 |
| 2010/0088575 | A1 | 4/2010 | Sharon et al. |

FOREIGN PATENT DOCUMENTS

JP 2006-279396 10/2006

* cited by examiner

*Primary Examiner* — Joseph D Torres
(74) *Attorney, Agent, or Firm* — Oblon, Spivak, McClleland, Maier & Neustadt, L.L.P.

(57) ABSTRACT

A memory controller including a buffer configured to perform decoding frame-unit data decoded by an LDPC decoder through partial parallel processing based on a check matrix made up of a block of a unit matrix and a plurality of blocks in which each row of the unit matrix is sequentially shifted and store threshold decision information of the data read from a memory section, an LLR conversion section configured to convert the threshold decision information to an LLR, an LMEM configured to store probability information β calculated during iteration processing that repeatedly performs column processing and row processing based on the LLR in an iteration unit equal to or smaller than a size of the block, and a CPU core configured to transfer the probability information β stored in the LMEM to the buffer every time the iteration processing in the iteration unit is completed.

16 Claims, 11 Drawing Sheets

|  | L0 | L1 | L2 | L3 | L4 | L5 | L6 | L7 |  |
|---|---|---|---|---|---|---|---|---|---|
|  | 1 | 0 | 0 | 0 | 0 | 0 | 0 | 0 | T0 |
|  | 0 | 1 | 0 | 0 | 0 | 0 | 0 | 0 | T1 |
| B(0) | 0 | 0 | 1 | 0 | 0 | 0 | 0 | 0 | T2 |
|  | 0 | 0 | 0 | 1 | 0 | 0 | 0 | 0 | T3 |
|  | 0 | 0 | 0 | 0 | 1 | 0 | 0 | 0 | T4 |
|  | 0 | 0 | 0 | 0 | 0 | 1 | 0 | 0 | T5 |
|  | 0 | 0 | 0 | 0 | 0 | 0 | 1 | 0 | T6 |
|  | 0 | 0 | 0 | 0 | 0 | 0 | 0 | 1 | T7 |

|  | L0 | L1 | L2 | L3 | L4 | L5 | L6 | L7 |  |
|---|---|---|---|---|---|---|---|---|---|
|  | 0 | 1 | 0 | 0 | 0 | 0 | 0 | 0 | T0 |
|  | 0 | 0 | 1 | 0 | 0 | 0 | 0 | 0 | T1 |
|  | 0 | 0 | 0 | 1 | 0 | 0 | 0 | 0 | T2 |
|  | 0 | 0 | 0 | 0 | 1 | 0 | 0 | 0 | T3 |
|  | 0 | 0 | 0 | 0 | 0 | 1 | 0 | 0 | T4 |
|  | 0 | 0 | 0 | 0 | 0 | 0 | 1 | 0 | T5 |
|  | 0 | 0 | 0 | 0 | 0 | 0 | 0 | 1 | T6 |
|  | 1 | 0 | 0 | 0 | 0 | 0 | 0 | 0 | T7 |

| SHIFT VALUE | LMEM VARIABLE ADDRESS | TMEM VARIABLE ADDRESS | ROTATION VALUE |
|---|---|---|---|
| 0 | 0, 1, 2, 3, 4, 5, 6, 7 | 0, 1, 2, 3, 4, 5, 6, 7 | 0 |
| 1 | 0, 1, 2, 3, 4, 5, 6, 7 | 0, 1, 2, 3, 4, 5, 6, 7 | 1 |
| 2 | 0, 1, 2, 3, 4, 5, 6, 7 | 0, 1, 2, 3, 4, 5, 6, 7 | 2 |
| 3 | 0, 1, 2, 3, 4, 5, 6, 7 | 0, 1, 2, 3, 4, 5, 6, 7 | 3 |
| 4 | 0, 1, 2, 3, 4, 5, 6, 7 | 0, 1, 2, 3, 4, 5, 6, 7 | 4 |
| 5 | 0, 1, 2, 3, 4, 5, 6, 7 | 0, 1, 2, 3, 4, 5, 6, 7 | 5 |
| 6 | 0, 1, 2, 3, 4, 5, 6, 7 | 0, 1, 2, 3, 4, 5, 6, 7 | 6 |
| 7 | 0, 1, 2, 3, 4, 5, 6, 7 | 0, 1, 2, 3, 4, 5, 6, 7 | 7 |

MEMORY CONTROLLER, SEMICONDUCTOR MEMORY APPARATUS AND DECODING METHOD

CROSS-REFERENCE TO RELATED APPLICATION

This application claims the benefit of Japanese Application No. 2011-110719 filed in Japan on May 17, 2011. The contents of which are incorporated herein by this reference.

FIELD

Embodiments described herein relate generally to a memory controller configured to decode LDPC-coded data, a semiconductor memory apparatus having the memory controller and a method of decoding LDPC-coded data.

BACKGROUND

To realize higher density recording of semiconductor memory apparatuses, development related to error correcting codes on digital data is underway. Error correcting codes can be roughly divided into an algebra-based error correction scheme and an error correction scheme through probability-based iterative calculations. Low density parity check codes (hereinafter referred to as "LDPC codes") that belong to the latter are reported to exhibit excellent near Shannon limit performance.

LDPC coded data can be subjected to parallel processing with a relatively small circuit scale using a sum-product algorithm or the like. However, for LDPC coded data having a long code, full parallel processing in which all processing is performed in parallel requires many operation circuits to be all mounted, which is not realistic.

For this reason, a decoding apparatus is disclosed which uses a check matrix in a configuration with an array of square matrices to perform partial parallel processing in block units using each square matrix as one block.

BRIEF DESCRIPTION OF THE DRAWINGS

FIG. 4A shows a check matrix H2 used for partial parallel processing according to the embodiment;

FIG. 4B shows shift values per block according to the embodiment;

FIG. 5A is a diagram illustrating a block shift of a check matrix H3 according to the embodiment showing a block with a shift value=0;

FIG. 5B is a diagram illustrating a block shift of the check matrix H3 according to the embodiment showing a block with a shift value=1;

FIG. 7 is a diagram illustrating shift processing according to the embodiment;

DETAILED DESCRIPTION

A memory controller according to one aspect of the present invention includes a first memory section configured to store threshold decision information of data read from a NAND type flash memory section when frame-unit data coded using a low density parity code is decoded through partial parallel processing based on a check matrix made up of a block composed of a unit matrix and a plurality of blocks in which each row of the unit matrix is sequentially shifted, an LLR conversion section configured to convert the threshold decision information to a logarithmic likelihood ratio, a second memory section configured to store probability information calculated during iteration processing of iteratively performing column processing and row processing in iteration units of a size of a block or smaller based on the logarithmic likelihood ratio and a control section configured to transfer the probability information stored in the second memory section to the first memory section every time iteration processing in iteration units is completed.

<LDPC Code and Partial Parallel Processing>

First, an LDPC code and partial parallel processing according to an embodiment will be described. An LDPC code is a linear code defined by a very sparse check matrix, that is, a check matrix composed of a very few non-zero elements, which can be expressed by a Tanner graph. The error correcting processing is equivalent to exchanging and updating results of local inferences between bit nodes corresponding to respective bits and check nodes corresponding to respective parity check equations of codewords connected on the Tanner graph.

Figures 1, 2:
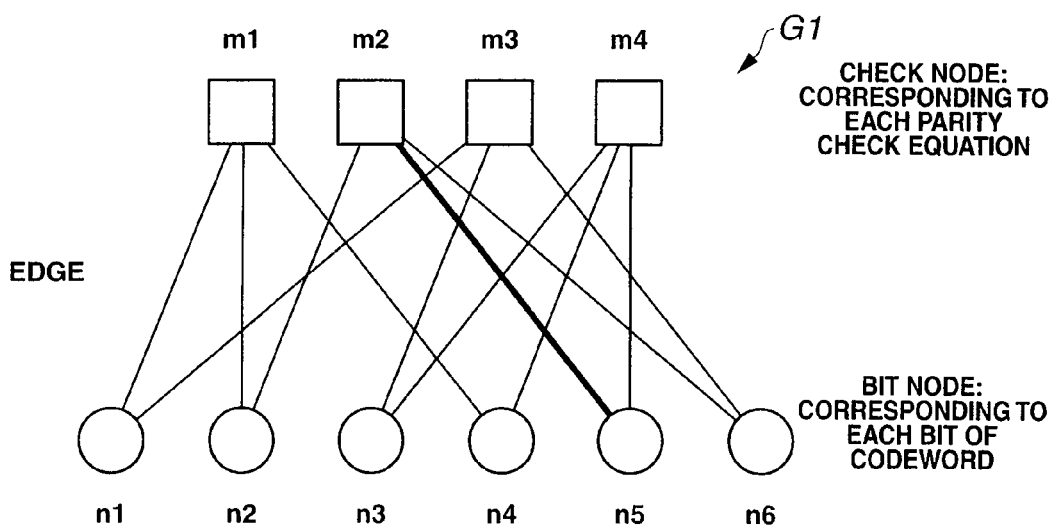
FIG. 1 is a diagram illustrating a check matrix H1 according to an embodiment.
FIG. 2 is a diagram illustrating a Tanner graph G1 according to the embodiment.

FIG. 1 illustrates a check matrix H1 with row weight wr=3 and column weight wc=2 in a (6, 2) LDPC code. The (6, 2) LDPC code refers to an LDPC code having a code length of 6 bits and an information length of 2 bits.

As shown in FIG. 2, when the check matrix H1 is expressed by a Tanner graph G1, a bit node corresponds to a column of the check matrix H and a check node corresponds to a row of the check matrix H. The Tanner graph G1 is configured by connecting between nodes of "1" among the elements of the check matrix H1 with edges. For example, "1" enclosed by a circle on a second row and a fifth column of the check matrix H1 corresponds to an edge shown by a thick line of the Tanner graph G1. The row weight wr=3 of the check matrix H1 corresponds to the number of bit nodes connected to one check node, that is, the number of edges 3 and the column weight wc=2 of the check matrix H corresponds to the number of check nodes connected to one bit node, that is, the number of edges 2.

The LDPC coded data is decoded by iteratively updating reliability (probability) information assigned to edges of the Tanner graph at each node. There are two kinds of reliability information; probability information from a check node to a bit node (hereinafter also referred to as "external value" or "external information" and represented by a symbol "α") and probability information from a bit node to a check node (hereinafter referred to as "a priori probability" or "a posteriori probability" or simply "probability" or "logarithmic likelihood ratio (LLR)" and represented by a symbol "Γ" or "λ"). The reliability updating processing is made up of row processing and column processing, and a unit when row processing and column processing are executed one time each is called "1-iteration (round) processing" and decoding processing is performed through iterative processing in which iteration processing is repeated.

As described above, the external value α refers to probability information from a check node to a bit node during LDPC decoding processing and the probability β refers to probability information from a bit node to a check node and these are terms well known to those skilled in the art.

The semiconductor memory apparatus reads threshold decision information from a memory cell that stores coded data. The threshold decision information is made up of a hard bit (HB) indicating whether the stored data is "0" or "1" and a plurality of soft bits (SB) indicating a likelihood of the hard bit. The threshold decision information is converted to an LLR according to an LLR table created beforehand and becomes an initial LLR of iteration processing.

Hereinafter, the row processing and column processing will be described using part of the Tanner graph G2 shown in FIG. 3A to FIG. 3D. The bit node processing (column processing) will be described using FIG. 3A and FIG. 3B first. Suppose an LLR which is initial reliability of an inputted codeword bit corresponding to a certain bit node, for example, bit node 3 is λ(3) and suppose a probability from a check node to this bit node 3 is α(j, 3). Here, j indicates a check node number connected to the bit node 3.

The bit node 3 performs a calculation expressed by (Equation 1) below on a check node with an edge corresponding to α(1, 3), that is, check node 1.

$$\beta(3,1)=\epsilon(3)+\alpha(2,3) \qquad \text{(Equation 1)}$$

Similarly, a calculation expressed by (Equation 2) below is performed on a check node of a node number j.

$$\beta(3,j)=\lambda(3)+\Sigma\alpha(k,3) \qquad \text{(Equation 2)}$$

Here, Σ means the sum total except k=j of check nodes connected to the bit node 3.

The above described calculations are performed on all bit nodes and β(i, 1) expressed by (Equation 3) below is calculated. Assuming the code length is N and the node number is i here, i=1 to N. Furthermore, Σ means a sum total except k=j of check nodes connected to the bit node i.

$$\beta(i,j)=\lambda(i)+\Sigma\alpha(k,i) \qquad \text{(Equation 3)}$$

Figure 3A:
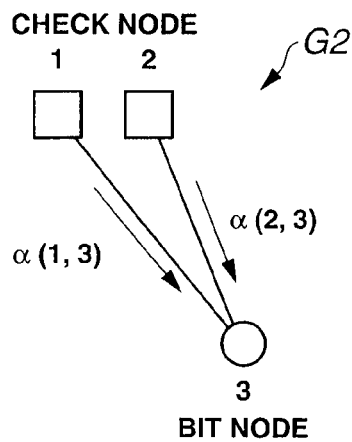
FIG. 3A and FIG. 3B are diagrams illustrating row processing in the case of a Tanner graph G2 according to the embodiment.
Figure 3B:
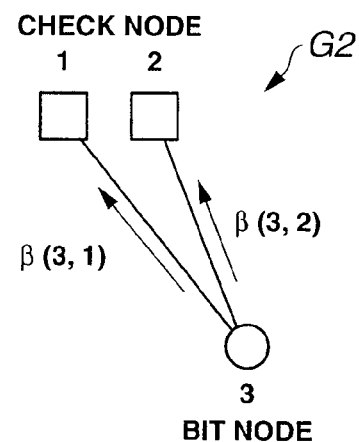
Figure 3C:
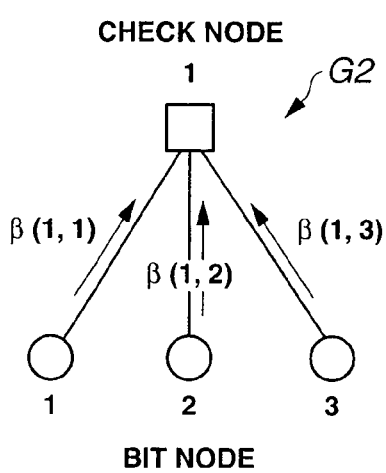
FIG. 3C and FIG. 3D are diagrams illustrating column processing in the case of the Tanner graph G2 according to the embodiment.
Figure 3D:
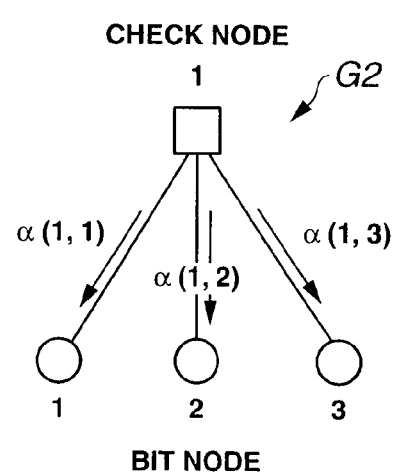

Next, check node processing (row processing) will be described using FIG. 3C and FIG. 3D. When external information which is a message to a certain check node, for example, check node 1 is assumed to be β(k, 1), this check node calculates α(1, 1) which is expressed by (Equation 4) below for the bit node 1 which is the bit node of the edge corresponding to β(1, 1).

$$\alpha(1,1)=\text{sign}(\Pi\beta((m,1))\times\min(|\beta(m,1)|) \qquad \text{(Equation 4)}$$

where k is a bit node number connected to this check node 1. Reference character m is selected from "2" to "3." Here, sign(Πβ(m, 1)) means a sign ("+1" or "−1") of the result of multiplying β(m, 1) by m=2 to 3. Furthermore, |β(m, 1)| is an absolute value of β(m, 1) and min is a function that selects a minimum value from a plurality of pieces of |β(m, 1)|.

Similarly, α(1, i) is also calculated using (Equation 5) below.

$$\alpha(1,i)=\text{sign}(\Pi\beta(m,1))\times\min\{|\beta(m,1)|\} \qquad \text{(Equation 5)}$$

where i is a bit node number connected to the check node 1 and is "1," "2" or "3" in the example of the Tanner graph in FIG. 1A. Furthermore, suppose m is other than m=i among the bit nodes connected to the check node 1.

The above described calculations are performed on all check nodes and α(j, i) is calculated using (Equation 6) below.

$$E(j,i)=\text{sign}(\Pi\beta(m,j))\times\min(|\beta(m,j)|) \qquad \text{(Equation 6)}$$

where m is other than m=i among the bit nodes connected to the check node j.

The iterative decoding calculates a posteriori probability Pb(i) according to (Equation 7) below per iteration processing (1 round) in which the above described bit node processing and check node processing are executed one time each.

$$Pb(i)=\lambda(i)+\Sigma\alpha(k,i) \qquad \text{(Equation 7)}$$

where i=1 to N and N denotes a code length. Σ is the sum of all nodes connected to the bit node i.

A bit decision, that is, a hard decision as to whether the bit is "0" or "1" is made based on a posteriori probability value (temporary estimated word) Pb. Using this hard decision result, a parity check is performed on the LDPC code and iterative processing is ended when it is confirmed that there is no error.

Here, as the message transmission algorithm, a reliability updating algorithm at bit nodes and check nodes using a sum-product algorithm or mini-sum-product algorithm or the like can perform decoding processing through parallel processing.

However, for LDPC coded data of a long code, full parallel processing in which all processing is performed in parallel requires many operation circuits to be all mounted, which is not realistic.

By contrast, use of a check matrix configured by combining a plurality of unit matrices (hereinafter also referred to as "block") allows the circuit scale to be reduced by carrying out partial parallel processing using an operation circuit with p bit nodes of a block size of p.

Figures 4A, 4B:
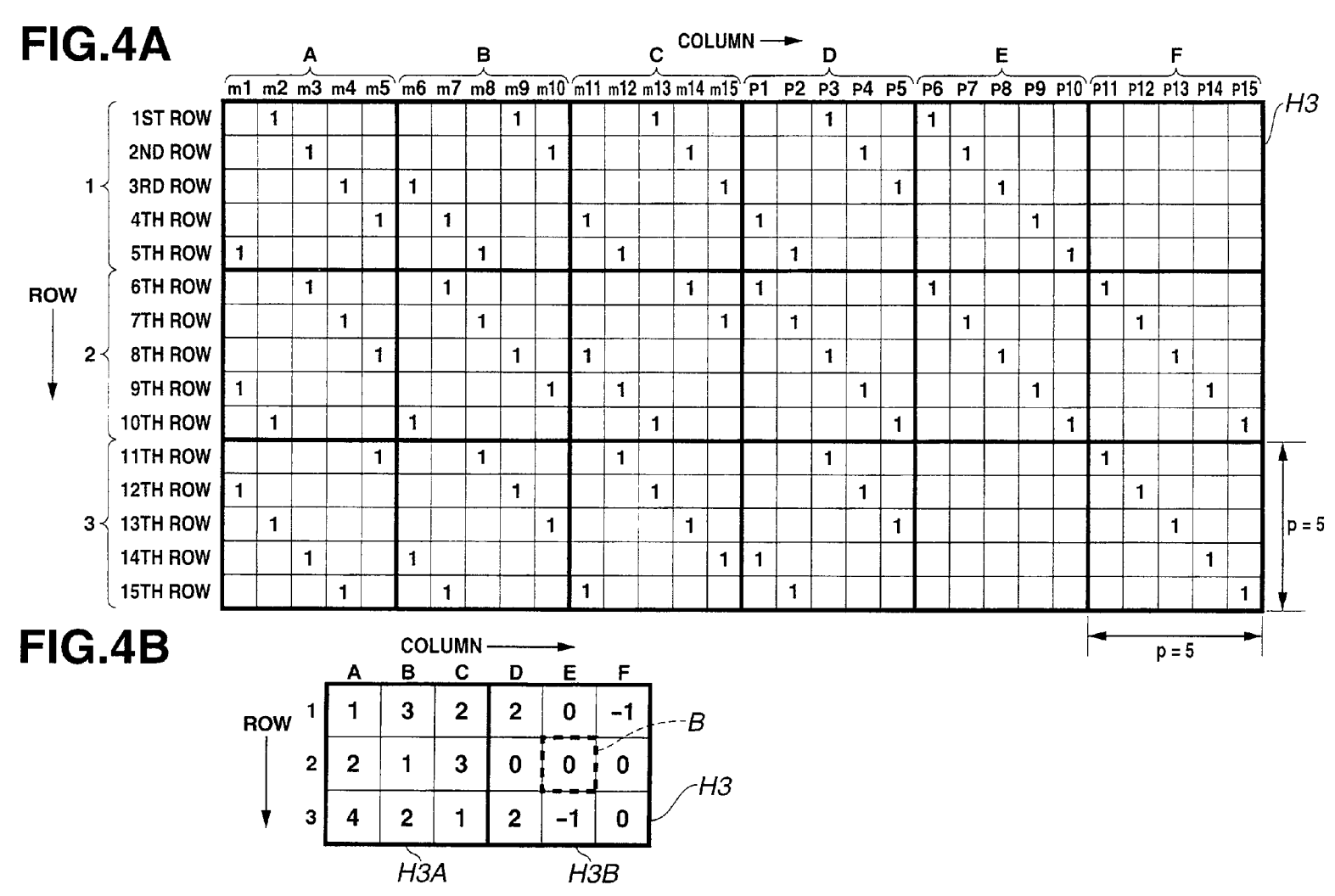

FIG. 4A shows a check matrix H3 configured by combining a plurality of unit matrices. The check matrix H3 is made up of five and three blocks arranged horizontally and vertically, each block (segment) containing 5×5 elements, amounting to 15 rows and 30 columns in vertical and horizontal directions.

As shown in FIG. 4A, each block B of the check matrix H3 is a square matrix (hereinafter referred to as "shift matrix") resulting from shifting a unit matrix whose diagonal components are "1"s with all the rest being "0"s by an amount corresponding to a numerical value. The check matrix H3 shown in FIG. 4A is made up of a coding target (message) block section H3A which is a user data block and a parity block section H3B for parity generated from the user data. As shown in FIG. 3A, a shift value "0" represents a unit matrix and a shift value "−1" represents a 0 matrix. Since the 0 matrix requires no actual operation processing, explanations thereof will be omitted below.

A bit that overflows through shift processing is inserted into a leftmost column in the block. In decoding processing using the check matrix H3, it is possible to obtain necessary information of a block, that is, information of a node to be processed by specifying a shift value. In the check matrix H3 composed of 5×5 blocks, the shift value is any one of five types of 0, 1, 2, 3 and 4 except 0 matrices which have no direct relationship with the decoding processing.

When the check matrix H3 combining square matrices of block size 5×5 (hereinafter referred to as "block size 5") shown in FIG. 4A is used, it is possible to execute partial parallel processing on five check nodes by providing five operation units in an operation section 113. Execution of partial parallel processing requires a bit node storage section (LMEM) 112 configured to store variables (hereinafter also referred to as "LMEM variables") for calculating a priori/a posteriori probability β in bit node units and a check node storage section (TMEM) 114 configured to store variables (hereinafter also referred to as "TMEM variables") for calculating an external value α in check node units. Since bit nodes are managed by addresses in the column direction (column addresses), the LMEM is managed by column addresses, while check nodes are managed by addresses in the row direction (row addresses), and therefore the TMEM is managed by row addresses. When the external value α and the probability β are calculated, an LMEM variable read from the LMEM and a MEM variable read from the TMEM are inputted to the operation circuit and operation processing is executed.

When decoding is performed using the check matrix H3 configured by combining a plurality of unit matrices, if a plurality of TMEM variables read from the TMEM are rotated through a rotator 113A according to a shift value, the whole check matrix H3 need not be stored.

For example, as shown in FIG. 5 and FIG. 6, in the case of processing of eight TMEM variables read from the TMEM 114 using a check matrix H4 of block size 8, a memory controller 103 uses the LMEM 112, a TMEM 126, the operation section 113 and the rotator 113A. The operation section 113 is made up of eight operation circuits ALU 0 to ALU 8 and can perform eight processes in parallel. There are eight types of shift values 0 to 7 when the check matrix H3 of block size 8 is used.

Figure 6A:
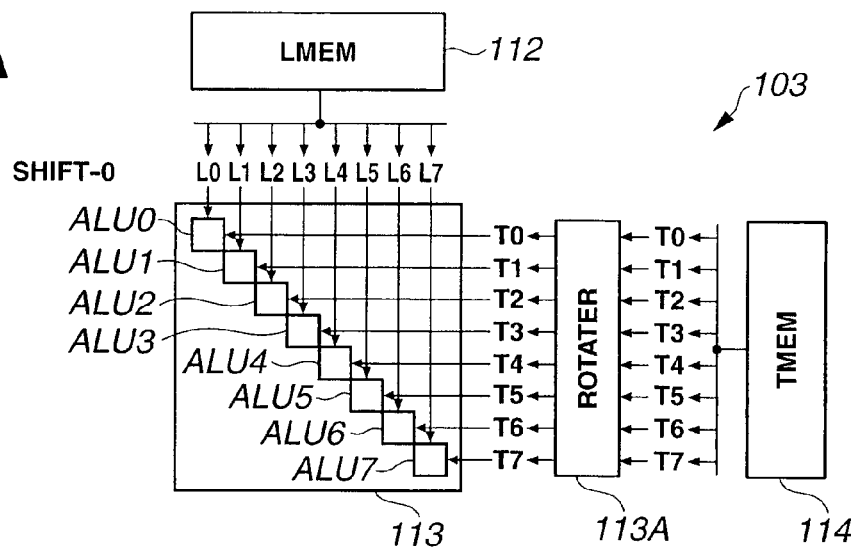
FIG. 6A to FIG. 6C are diagrams illustrating rotation processing according to the embodiment.

As shown in FIG. 5A and FIG. 6A, in the case of a block B(0) whose shift value is "0," the rotator 113A performs a rotation process with a rotation value of 0 and performs an operation between variables of the same address. However, the rotation process with the rotation value 0 means no rotation.
LMEM variable of column address 0, TMEM variable of row address 0 (shown by a broken line in FIG. 5A)
LMEM variable of column address 1, TMEM variable of row address 1
LMEM variable of column address 2, TMEM variable of row address 2
·
·
LMEM variable of column address 7, TMEM variable of row address 7 (shown by the broken line in FIG. 5A)

Figure 6B:
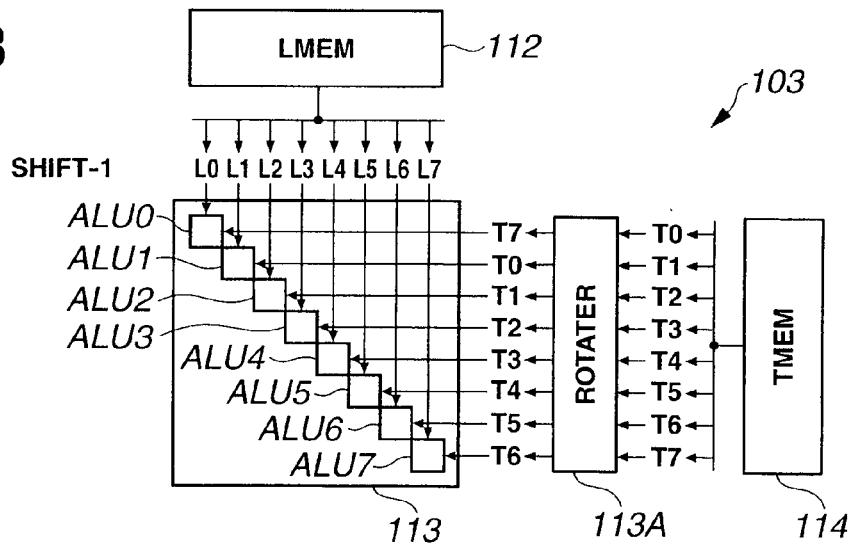

By contrast, as shown in FIG. 5B and FIG. 6B, in the case of a block B(1) whose shift value is "1," the rotator 113A performs a rotation process with a rotation value of 1 and performs an operation between the variables as shown below. That is, the rotation process with the rotation value of 1 is a shift process of shifting respective variables by one row downward and inserting the overflowing variables on the lowest row into the top row.
LMEM variable of column address 0, TMEM variable of row address 7 (shown by a broken line in FIG. 5B)
LMEM variable of column address 1, TMEM variable of row address 0 (shown by the broken line in FIG. 5B)
LMEM variable of column address 2, TMEM variable of row address 1
·
·
LMEM variable of column address 7, TMEM variable of row address 6

Figure 6C:
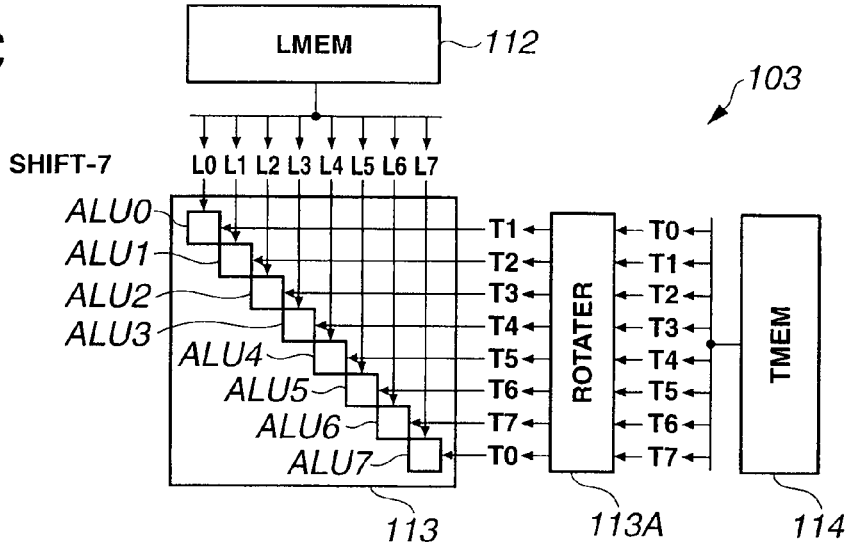

As shown in FIG. 6C, in the case of a block B(7) whose shift value is "7," the rotator 113A performs a rotation process with a rotation value of 7 and performs an operation between the variables as shown below. That is, the rotation process with the rotation value of 7 is a process of performing a rotation process with the rotation value of 1 seven times.
LMEM variable of column address 0, TMEM variable of row address 1
LMEM variable of column address 1, TMEM variable of row address 2
LMEM variable of column address 2, TMEM variable of row address 3
·
·
LMEM variable of column address 7, TMEM variable of row address 0

FIG. 7 shows a combination of operation circuit input variables per block shift value (0 to 7).

As described above, the rotator 113A rotates a variable read from the LMEM 112 or TMEM 114 to a rotation value corresponding to a shift value of the block before inputting the variable to the operation section 113. In the case of the memory controller 103 using the check matrix H3 of a block size 8, a maximum rotation value of the rotator 113A is "7" of "block size−1." Assuming the number of quantization bits of reliability is "u," the number of bits of the respective variables is "u" and therefore the width of input/output data of the rotator 113A is "8×u" bits.

First Embodiment

Hereinafter, a memory controller 3, a semiconductor memory apparatus and a decoding method according to a first embodiment of the present invention will be described. The memory controller 3 decodes frame-unit data coded with a low density parity code through partial parallel processing based on a check matrix made up of a block composed of a unit matrix and a plurality of blocks in which each row of the unit matrix is sequentially shifted.

Figure 8:
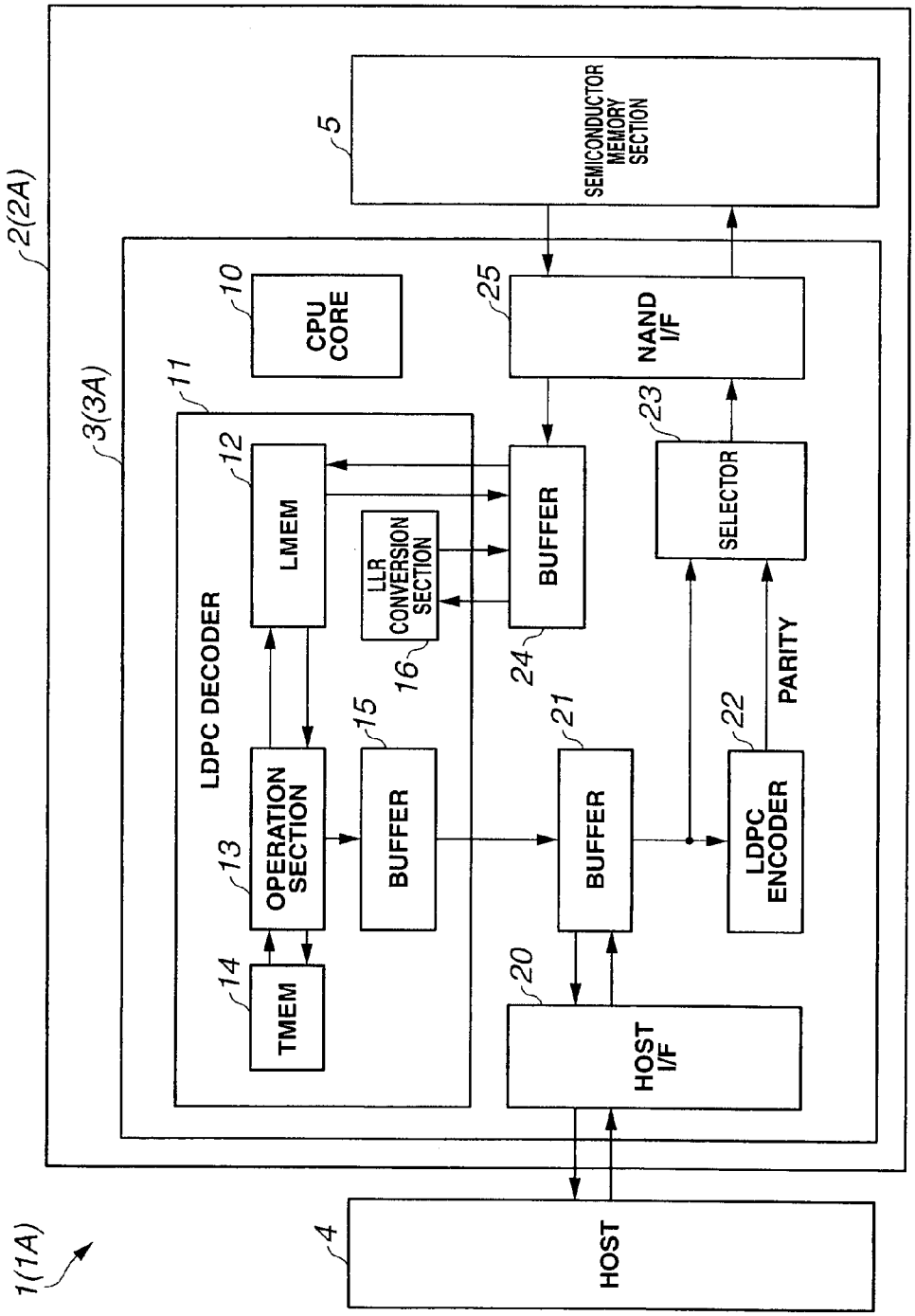
FIG. 8 is a configuration diagram illustrating a configuration of a memory card according to a first embodiment.

As shown in FIG. 8, a memory card 2 which is the semiconductor memory apparatus of the present embodiment stores data received from a host 4 such as a personal computer or digital camera as coded data, decodes the stored coded data and transmits the decoded data to the host 4. The memory card 2 and the host 4 constitute a memory system 1. The memory card 2 includes a semiconductor memory section (hereinafter simply referred to as "memory section") 5 and the memory controller 3. The memory section 5 is made up of a NAND type flash memory section.

The semiconductor memory apparatus according to the present embodiment may also be accommodated inside the host 4 and configured to store startup data or the like of the host 4, a so-called embedded type or may take the form of a semiconductor disk: SSD (Solid State Drive) or the like. Alternatively, the semiconductor memory apparatus and the host 4 may constitute a memory system such as an MP3 player which is a portable audio player.

The memory controller 3 includes a CPU core 10 which is a control section, an LDCP decoder 11, a host I/F (interface) 20, a buffer 21 which is a data buffer, an LDPC encoder 22, a selector 23, a buffer 24 which is a data buffer and a NAND I/F (interface) 25, all of which are connected via a bus (not shown).

As will be described later, the buffer 24 which is a first memory section configured to store threshold decision information which is data read from the NAND type flash memory section and probability information being decoded.

The LDCP decoder 11 includes a bit node storage section (LMEM) 12, an operation section 13, a check node storage section (TMEM) 14, a buffer 15 which is a decoded data storage memory and an LLR conversion section 16. The operation section 13 has p operation units corresponding in number to the block size. The memory controller 3 also includes components (not shown) such as a rotator which is part of the function of the operation section 13, a ROM configured to store execution programs of the CPU core 10 and an address conversion table or the like, an LLR storage section configured to store a logarithmic likelihood ratio (LLR) table and a hard decision section which is part of an LDPC decoder. The LMEM 12 is made up of a semiconductor memory such as an SRAM or register.

The memory controller 3 is configured to transmit/receive data to/from the host 4 via the host I/F (14) and transmit/receive data to/from the memory section 5 via the NAND I/F (25) under the control of the CPU core 10. Furthermore, the memory controller 3 realizes address management of the memory section 5 through FW (firmware) executed by the CPU core 10.

Next, processes of storing and reading data in/from the memory section 5 will be described in brief.

As shown in FIG. 8, during data storage processing, data transmitted from the host 4 is temporarily stored in the buffer 21 and a LDPC parity is generated by the LDPC encoder 22. The selector 23 adds the parity to frame-unit data and outputs the data as LDPC coded data. The LDPC coded data is then stored in the memory section 5 via the NAND I/F (25).

On the other hand, during data read processing, predetermined voltages are sequentially applied to the respective memory cells of the memory section 5 through a command from the host 4 and threshold decision information is read. The threshold decision information is made up of a hard bit (FIB) indicating whether the stored bit data is "0" or "1" and a plurality of soft bits (SB) indicating likelihood of the hard bit. The data decoded by the LDPC decoder 11 is transmitted to the host 4 based on the threshold decision information.

Next, decoding by the memory controller 3 will be described in detail according to the flowcharts in FIG. 9 and FIG. 10. For simplicity of explanation, a case will be taken as an example where a page size which is the storage/reading processing unit and an LDPC frame (hereinafter also referred to as "frame") size which is a coding/decoding processing unit are the same 30 bits and the block size p is as extremely short as 5 bits. Furthermore, suppose the check matrix has six column blocks and four row blocks.

<Step S10> Reception of Threshold Decision Information

The memory controller 3 receives threshold decision information of frame-unit data read from the memory section 5 through a command from the host 4. Here, the threshold decision information of the respective bits is made up of a hard bit (HB) and, for example, three types of soft bits (SB1, SB2, SB3). The type of the soft bits differs depending on the memory system.

<Step S11> Step of Storing Threshold Decision Information in First Memory Section The threshold decision information (HB, SB1, SB2, SB3) each having four bits is stored in frame units in the buffer 24 which is the first memory section. In other words, the buffer 24 stores the threshold decision information of the data read from the NAND type flash memory section. Since the frame size is 30 bits, the threshold decision information stored in the buffer 24 has 120 (4×30) bits.

As will be described later, the threshold decision information and LLR data are preferably stored in the buffer 24 so as to be distinguishable by bit addresses. For this reason, the buffer 24 is provided with a storage module of an LLR addition bit (LB) of one bit in addition to a module configured to store the threshold decision information of four bits.

That is, the buffer 24 is made up of an HB module, an SB1 module, an SB2 module, an SB3 module and an LB module, each of which has 30 bits, the storage capacity amounting to 150 bits. Suppose bit addresses for storing data of the same frame are common among those modules.

<Step S12> LLR Conversion Step

The frame-unit threshold decision information stored in the buffer 24 is converted to logarithmic likelihood ratio (LLR) data indicating likelihood of the HB by the LLR conversion section 16. The LLR conversion section 16 performs conversion processing using a predetermined quantization hit rate Q based on a threshold voltage distribution of the memory cell and based on an LLR table created beforehand.

When the quantization bit rate Q is 5, the LLR conversion section 16 converts the 1-bit HB to 5-bit LLR data. The first one bit of the LLR data is the HB. When the frame size is 30 bits and the quantization bit rate Q is 5, the frame-unit LLR data size is 150 bits.

<Step S13> Step of Transferring (Writing Back) LLR Data to Second Memory Section The LLR data of frame-unit 150 bits converted by the LLR conversion section 16 is transferred to and stored in the buffer 24. That is, the threshold decision information is erased from the buffer 24 and LLR data is stored therein instead.

As has already been described, the LLR data is preferably stored in a region (address) where the threshold decision information before the conversion is stored. That is, the LLR data is preferably stored in the same bit address as that of the threshold decision information before the conversion. This is to realize sharing (data management) of the LMEM 12 and the buffer 24 without performing complicated data format conversion.

In order to store the threshold decision information and/or the LLR data at the same address, the quantization bit rate Q and the number of threshold decision information bits need to have the same bit length (number of bits). However, even when both are different as in the case of the present embodiment where the quantization bit rate is 5 and the number of threshold decision information bits is 4, it is possible to store those values at the same address by setting the LB module of (quantization bit rate—threshold decision information bit length) in the buffer 24.

In the buffer 24 of the present embodiment, the respective bits of the 5-bit LLR data are stored in the HB module, the SB1 module, the SB2 module, the SB3 module and the LB module respectively.

<Step S14> Iteration Count Initialization

The iteration count is initialized to 0.

<Step S15> LDPC Decoding Subroutine Processing

Figure 10:
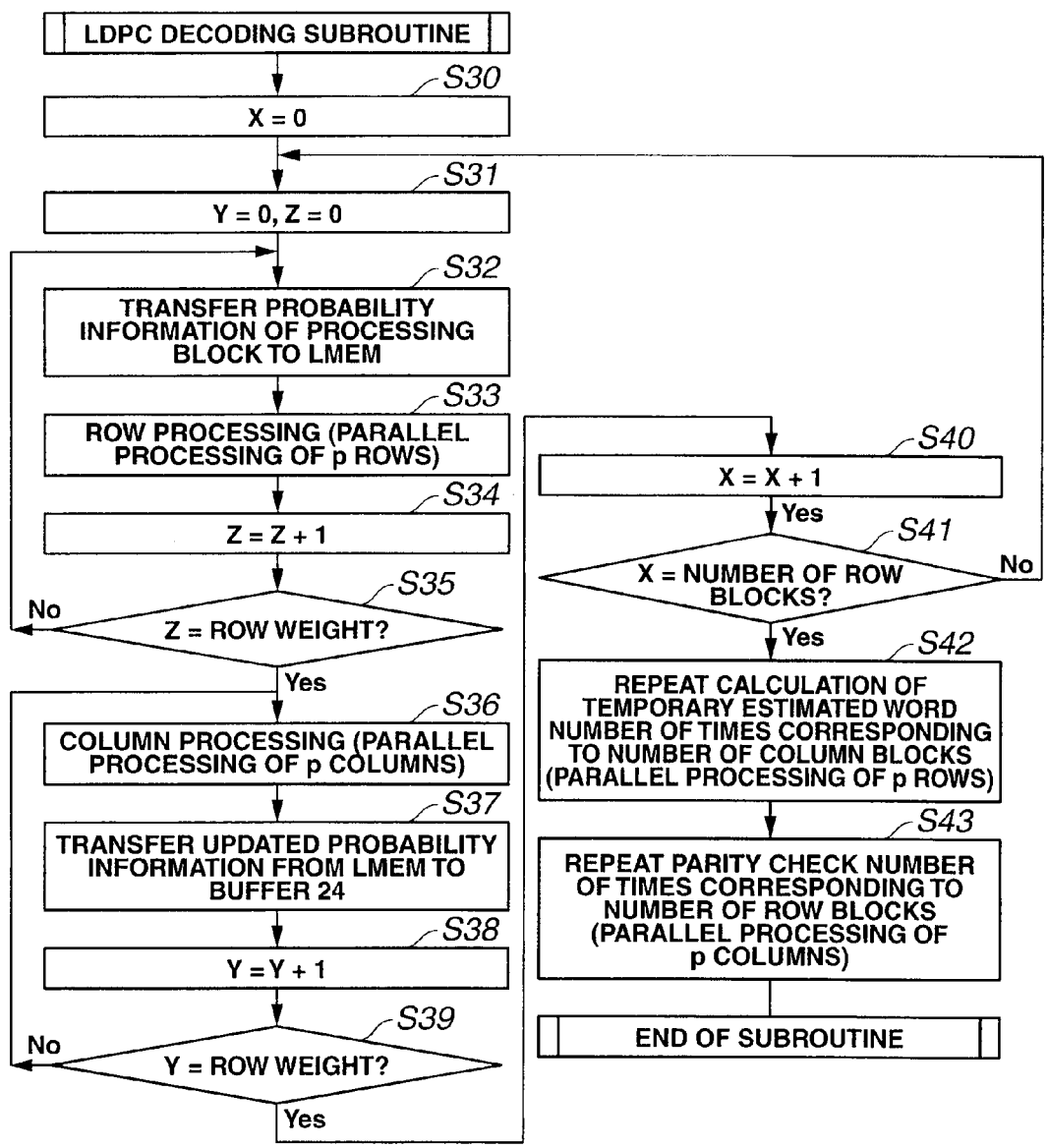
FIG. 10 is a flowchart illustrating the flow of memory card decoding according to the first embodiment.

LDPC decoding subroutine processing in step S30 to step S43 shown in FIG. 10 is performed.

<Step S30, Step S31>

This is initialization processing for iterative processing.

<Step S32> LLR of Processing Block Transferred to LMEM

In order to perform iteration processing in block units, block-unit (p=5 bits) LLR data (5×5=25 bits) of the check matrix is transmitted from the buffer 24 to the LMEM 12 which is the second memory section under the control of the CPU core 10 and stored in the LMEM 12. That is, the capacity of the LMEM 12 may be 25 bits.

<Step S33> Row Processing

Row processing is performed in parallel through p operation circuits.

<Steps S34 to S35>

This is a counting step for iterative processing.

<Step S36> Column Processing

Column processing is performed in parallel through p operation circuits.

<Step S37> Updated β is Transferred from LMEM to Buffer 24

The probability information (a posteriori probability, LLR) β updated through the iteration processing and stored in the LMEM 12 is transferred to the buffer 24 again under the control of the CPU core 10. That is, the CPU core 10 which is the control section transfers the probability information stored in the LMEM 12 which is the second memory section to the buffer 24 which is the first memory section every time the iteration processing in iteration units is completed.

The updated probability information β is preferably stored in the region where the LLR data of the block is stored, that is, at the same address. In other words, the CPU core 10 which is the control section preferably transfers the probability information calculated through iteration processing of one iteration unit to the address at which the threshold decision information of one iteration unit of the buffer 24 which is the first memory section. This is because data management by addresses is easier.

<Step S38 to Step S41>

This is a counting step for iterative processing.

<Step S42> Temporary Estimated Word Calculation Step

When iteration processing of all blocks is completed (S23=Yes), the hard decision section of the LDPC decoder 11 calculates temporary estimated words block by block through parallel processing based on the updated probability information (a posteriori probability) β.

<Step S43> Parity Check Step

Parity checks are performed block by block through parallel processing based on the temporary estimated words.

This completes the LDPC decoding subroutine processing in step S30 to step S43.

Here, processing contents of the LDPC decoding subroutine processing (steps S30 to S43) will be described in detail taking a case of using the check matrix H2 in FIG. 4 as an example.

The LDPC decoding subroutine processing performs the following processing according to iteration control variables X, Y and Z.

X=0: Execute processing of row 1
X=1: Execute processing of row 2
X=2: Execute processing of row 3
Z=0: Execute processing of column A
Z=1: Execute processing of column B
Z=2: Execute processing of column C
Z=3: Execute processing of column D
Z=4: Execute processing of column E
Z=5: Execute processing of column F
Y=0: Execute processing of column A
Y=1: Execute processing of column B
Y=2: Execute processing of column C
Y=3: Execute processing of column D
Y=4: Execute processing of column E
Y=5: Execute processing of column F <Processing when X=0>

[1] Row Processing (1) Transfer probability information of m1 to m5 to LMEM. Execute row processing of block (A, 1) (parallel processing of p rows)

(2) Transfer probability information of m6 to m10 to LMEM. Execute row processing of block (B, 1) (parallel processing of p rows)

(3) Transfer probability information of m11 to m15 to LMEM. Execute row processing of block (C, 1) (parallel processing of p rows)

(4) Transfer probability information of p1 to p5 to LMEM. Execute row processing of block (D, 1) (parallel processing of p rows)

(5) Transfer probability information of p6 to p10 to LMEM. Execute row processing of block (E, 1) (parallel processing of p rows)

(6) Transfer probability information of p11 to p15 to LMEM. Execute row processing of block (F, 1) (parallel processing of p rows)

Obtain p (5) α in the above processing and store them in the TMEM.

[2] Column Processing (7) Execute column processing of block (A, 1) (parallel processing of p columns)

(8) Execute column processing of block (B, 1) (parallel processing of p columns)

(9) Execute column processing of block (C, 1) (parallel processing of p columns)

(10) Execute column processing of block (D, 1) (parallel processing of p columns)

(11) Execute column processing of block (E, 1) (parallel processing of p columns)

(12) Execute column processing of block (F, 1) (parallel processing of p columns)

<Processing when X=1>

[1] Row Processing (1) Transfer probability information of m1 to m5 to LMEM. Execute row processing of block (A, 2) (parallel processing of p rows).

(2) Transfer probability information of m6 to m10 to LMEM. Execute row processing of block (B, 2) (parallel processing of p rows).

(3) Transfer probability information of m11 to m15 to LMEM. Execute row processing of block (C, 2) (parallel processing of p rows).

(4) Transfer probability information of p1 to p5 to LMEM. Execute row processing of block (D, 2) (parallel processing of p rows).

(5) Transfer probability information of p6 to p10 to LMEM. Execute row processing of block (E, 2) (parallel processing of p rows).

(6) Transfer probability information of p11 to p15 to LMEM. Execute row processing of block (F, 2) (parallel processing of p rows).

Obtain p (5) a in the above processing and store them in the TMEM.

[2] Column Processing (7) Execute column processing of block (A, 2) (parallel processing p columns).

(8) Execute column processing of block (B, 2) (parallel processing p columns).

(9) Execute column processing of block (C, 2) (parallel processing p columns).

(10) Execute column processing of block (D, 2) (parallel processing p columns).

(11) Execute column processing of block (E, 2) (parallel processing p columns).
(12) Execute column processing of block (F, 2) (parallel processing p columns).
<Processing when X=2>
[1] Row Processing
(1) Transfer probability information of m1 to m5 to LMEM. Execute row processing of block (A, 3) (parallel processing of p rows).
(2) Transfer probability information of m6 to m10 to LMEM. Execute row processing of block (B, 3) (parallel processing of p rows).
(3) Transfer probability information of m11 to m15 to LMEM. Execute row processing of block (C, 3) (parallel processing of p rows).
(4) Transfer probability information of p1 to p5 to LMEM. Execute row processing of block (D, 3) (parallel processing of p rows).
(5) Transfer probability information of p6 to p10 to LMEM. Execute row processing of block (E, 3) (parallel processing of p rows).
(6) Transfer probability information of p11 to p15 to LMEM. Execute row processing of block (F, 3) (parallel processing of p rows).
Obtain p (5) α in the above processing and store them in the TMEM.
[2] Column Processing
(7) Execute column processing of block (A, 3) (parallel processing of p columns)
(8) Execute column processing of block (B, 3) (parallel processing of p columns)
(9) Execute column processing of block (C, 3) (parallel processing of p columns)
(10) Execute column processing of block (D, 3) (parallel processing of p columns)
(11) Execute column processing of block (E, 3) (parallel processing of p columns)
(12) Execute column processing of block (F, 3) (parallel processing of p columns)
For example, the processing described above is executed in the LDPC decoding subroutine.
<Step S16> Parity Check OK?
When a parity check results in OK (Yes), processing from step S17 is executed.
When the parity check results in NG (No), processing from step S18 is executed.
<Step S18, S19> Iteration Count Check
Processing from S15 is repeatedly executed using updated probability information until iteration processing of a predetermined maximum count.
<Step S20> Transmission of Error Response Signal
When decoding is not possible (parity check NG) even if iteration processing of a maximum count is executed, the controller 3 transmits an error response signal to the host 4. The iteration limit of the iteration processing may be managed, not by count but by time.
Alternatively, when the memory controller 3 stores a plurality of LLR tables in the LLR storage section, the LLR conversion section 16 may reconvert threshold decision information using another LLR table and execute iteration processing using new LLR data. In this case, it is necessary to read threshold decision information from the memory section 5 again and store it in the buffer 24. This causes the decoding time to extend, but a throughput enough for practical use can be maintained as long as the LLR re-conversion frequency is low.

<Step S17> Transmission of Decoded Data
When the parity check results in OK (S16: Yes), the decoded data is temporarily stored in the buffer 21 and then transmitted to the host 4 via the HOST I/F (20).
<Comparison>
Here, a case with a memory controller of simple control will be described for comparison. In the memory controller in the comparative example, 150-bit LLR data converted by the LLR conversion section 16 based on, for example, the threshold decision information stored in the buffer 24 is stored in the LMEM 12. The capacity of the LMEM required for this is 150 bits. That is, the capacity of the LMEM is (frame size×quantization bit rate).
Particularly since the number of bit nodes increases as the code length increases, the capacity of the LMEM for storing LLR data of each bit node increases and the circuit scales of the LDPC decoder and the memory controller increase. On the other hand, the buffer 24 is not used during decoding.
By contrast, as described above, the memory controller 3 of the memory card 2 may adopt 25 bits (block size (5)×quantization bit rate (5)) as the size of the LMEM 12. This is intended to make use of the buffer 24 disposed as a function different from the function of the LDPC decoder 11 during decoding.
That is, the memory controller 3 of the memory card 2 substitutes the buffer 24 which remains idling (on standby) during decoding for part of the function of the LMEM 12, and thereby reduces the total memory capacity of the memory controller compared to a case with an LMEM having a capacity of (frame size×quantization bit rate).
Compared to the memory controller in the comparative example, the memory controller 3 processes more access to the buffer 24. However, since the memory controller 3 executes block-unit pipelining, the throughput is hardly different from that of the memory controller in the comparative example.
Hereinafter, a comparison will be made in the buffer capacity necessary to be mounted between the memory controller 3 of the present embodiment and the memory controller in the comparative example. Suppose quantization bit rate Q=5 bits, frame size L=page size=4096 bytes, type of SB=(S-1) and block size B=16 bytes.
As shown in Table 1 below, while the memory controller in the comparative example requires a total capacity of 36864 bytes, the memory controller 3 of the present embodiment requires a total capacity of 20560 bytes. That is, the capacity ratio is 20560/36864=0.56 and the memory controller 3 of the present embodiment can reduce the memory (buffer) capacity by approximately 44%.

TABLE 1

|  | Comparative example |  | Present embodiment |  |
|---|---|---|---|---|
| First memory section (buffer 24) | L × S |  | L × Q |  |
| Second memory section (LMEM 12) | L × Q |  | B × Q |  |
| First memory section + second memory section | L(S + Q) | 4096 Byte × (5 + 4) = 36864 Byte | Q(L + B) | 5 × (4096 Byte + 16 Byte) = 20560 Byte |

As described above, the memory controller 3 and the memory card 2 provided with the memory controller 3 of the present embodiment have a smaller memory capacity and a smaller circuit scale. For this reason, the memory controller 3 and the memory card 2 have small power consumption and offer excellent energy-saving characteristics. Furthermore, the decoding method of the present embodiment has small power consumption and offers excellent energy-saving characteristics and high efficiency.

The memory system 1 that the memory card 2 constitutes together with the host 4 also offers small power consumption and excellent energy-saving characteristics because the memory card 2 has a small mounting memory capacity and a small circuit scale.

Second Embodiment

Hereinafter, a memory card 2A and a memory controller 3A according to a second embodiment will be described. The memory card 2A and the memory controller 3A are similar to the memory card 2 and the memory controller 3 according to the first embodiment, and therefore the same components will be assigned the same reference numerals and descriptions thereof will be omitted.

Although the first embodiment has described an example where the block size p is extremely small (p=5 or the like) for simplicity of explanation, the block size in an actual product has quite a large value, for example, on the scale of 128 to 256. The operation section 13 needs to be provided with p operation circuits.

On the contrary, in the memory controller 3A of the memory system 1A, an iteration unit, that is, a parallel processing unit is a divided block unit resulting from further dividing the block size p by D (D is a natural number equal to or greater than 2). That is, in the memory card 2A and the memory controller 3A, the number of operation units of the operation section 13A is reduced to 1/D and the level of parallelism is intentionally reduced to avoid the circuit scale from increasing.

Figure 9:
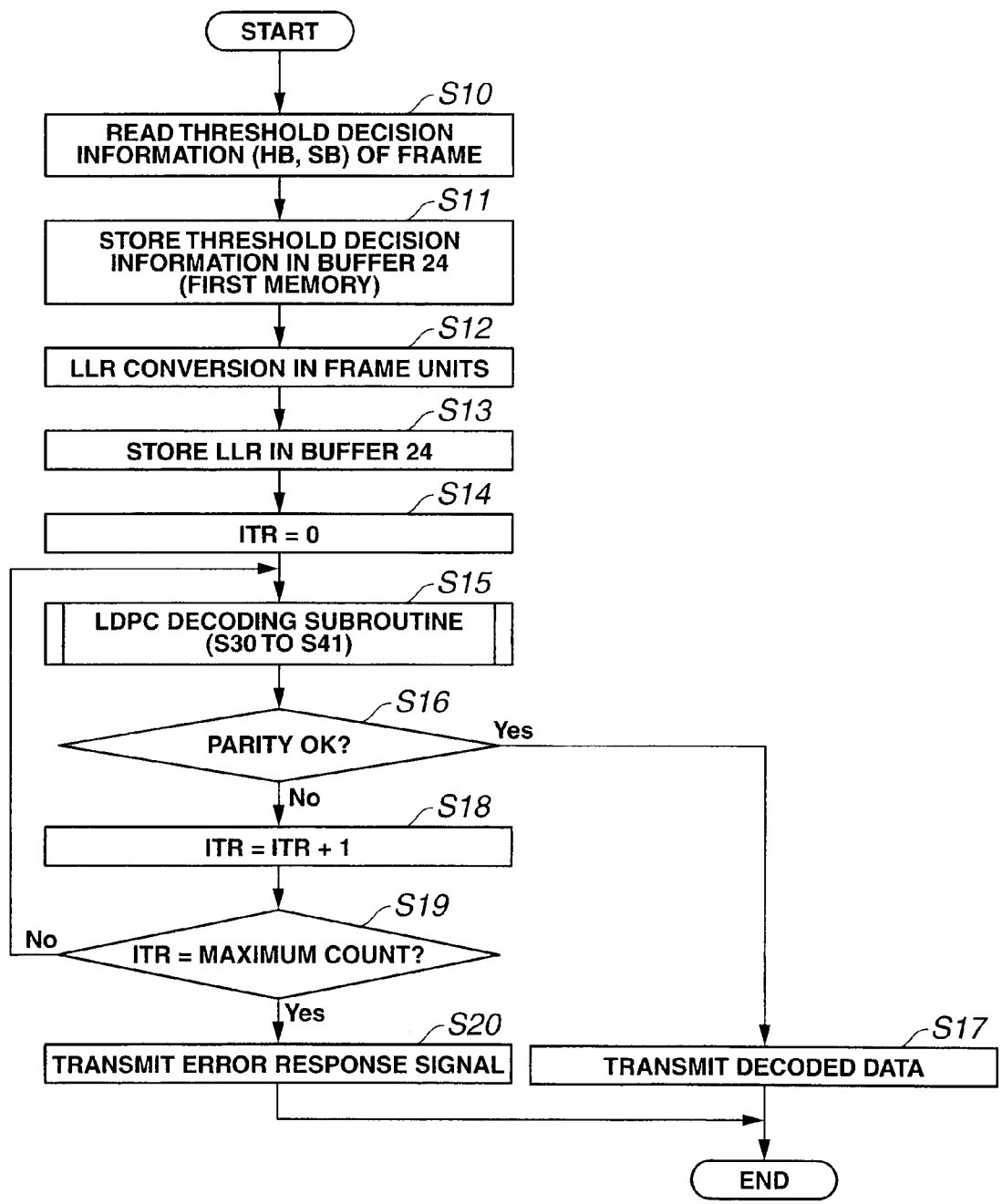
FIG. 9 is a flowchart illustrating a flow of memory card decoding according to the first embodiment.

That is, in step S14 shown in FIG. 9, the LLR data is divided into block units having a size of (p/D) under the control of the CPU core 10. The processing in steps S15 to S17 may be executed in divided block units or in block units.

Furthermore, not only the number of operation units but also the capacity of the LMEM 12 can be reduced to 1/D in the case of block size processing. The upper limit of D is determined as appropriate in consideration of tradeoffs between the frame size and processing speed or the like, and is, for example, 16.

The memory card 2A and the memory controller 3A have the effects of the memory card 2 and the memory controller 3, and can further reduce the circuit scale. Furthermore, the decoding method of the present embodiment has the effects of the decoding method of the first embodiment, and is further efficient.

Third Embodiment

Hereinafter, a memory card 2B and a memory controller 3B according to a third embodiment will be described. The memory card 2B and the memory controller 3B are similar to the memory card 2 and the memory controller 3 according to the first embodiment, and therefore the same components will be assigned the same reference numerals and descriptions thereof will be omitted.

In the first embodiment, in step S10, threshold decision information made up of the hard bit (FIB) and three types of soft bits (SB1, SB2, SB3) is read from the memory section 5 according to a command from the host 4 and decoded.

Figure 11:
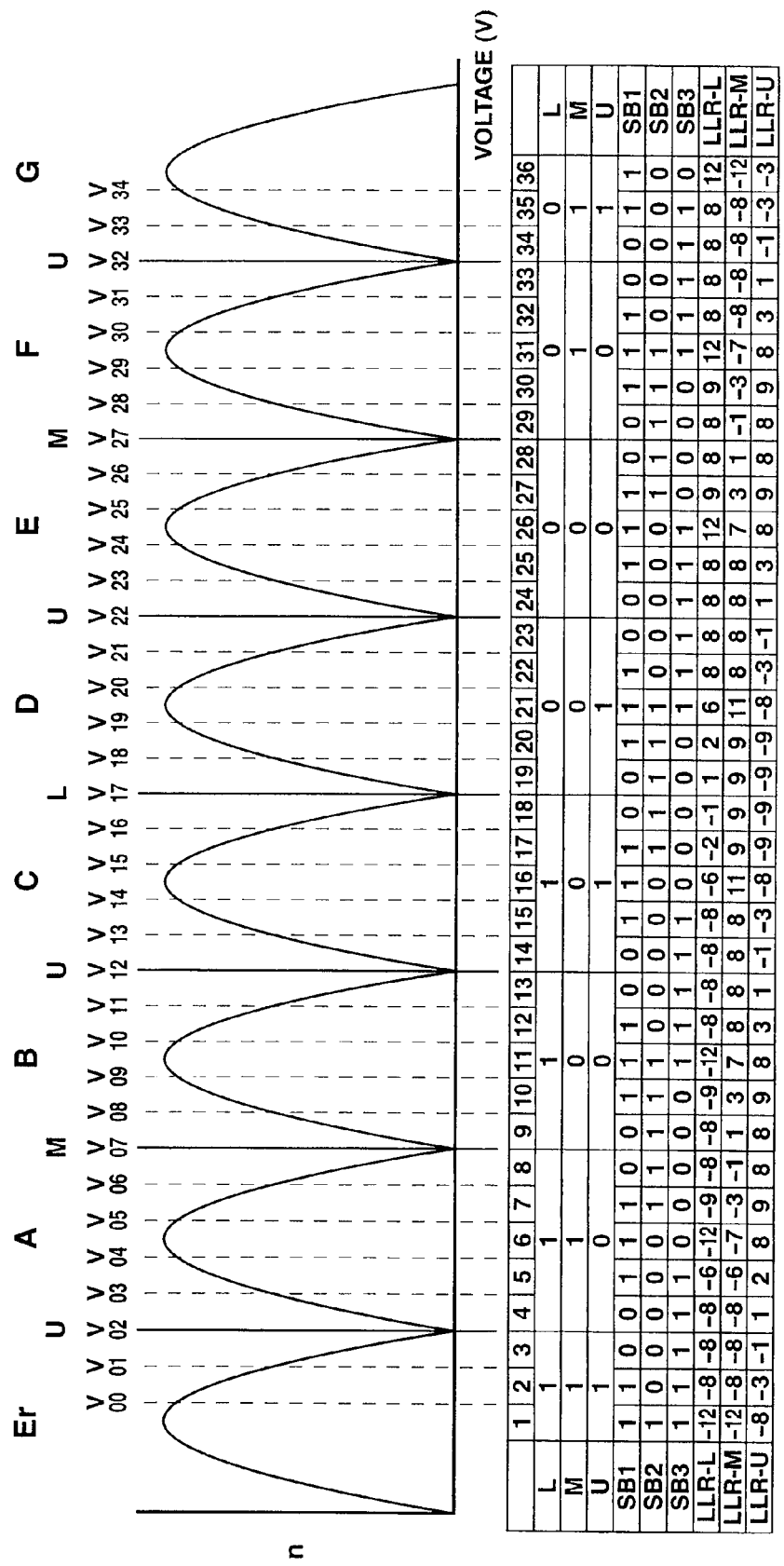
FIG. 11 is a diagram illustrating a relationship between a threshold voltage distribution, stored data and a logarithmic likelihood ratio table for illustrating memory card decoding according to a third embodiment.

As shown in FIG. 11, when, for example, 3-bit data is stored in one memory cell, in order to read three types of HB and three types of SB, it is necessary to apply 35 types of voltages of V00 to V34 to their respective memory cells.

By contrast, the memory controller 3B of the memory system 1B of the present embodiment reads threshold decision information made up of only HBs, performs decoding and further performs decoding by reading the SB when decoding is not possible.

Figure 12:
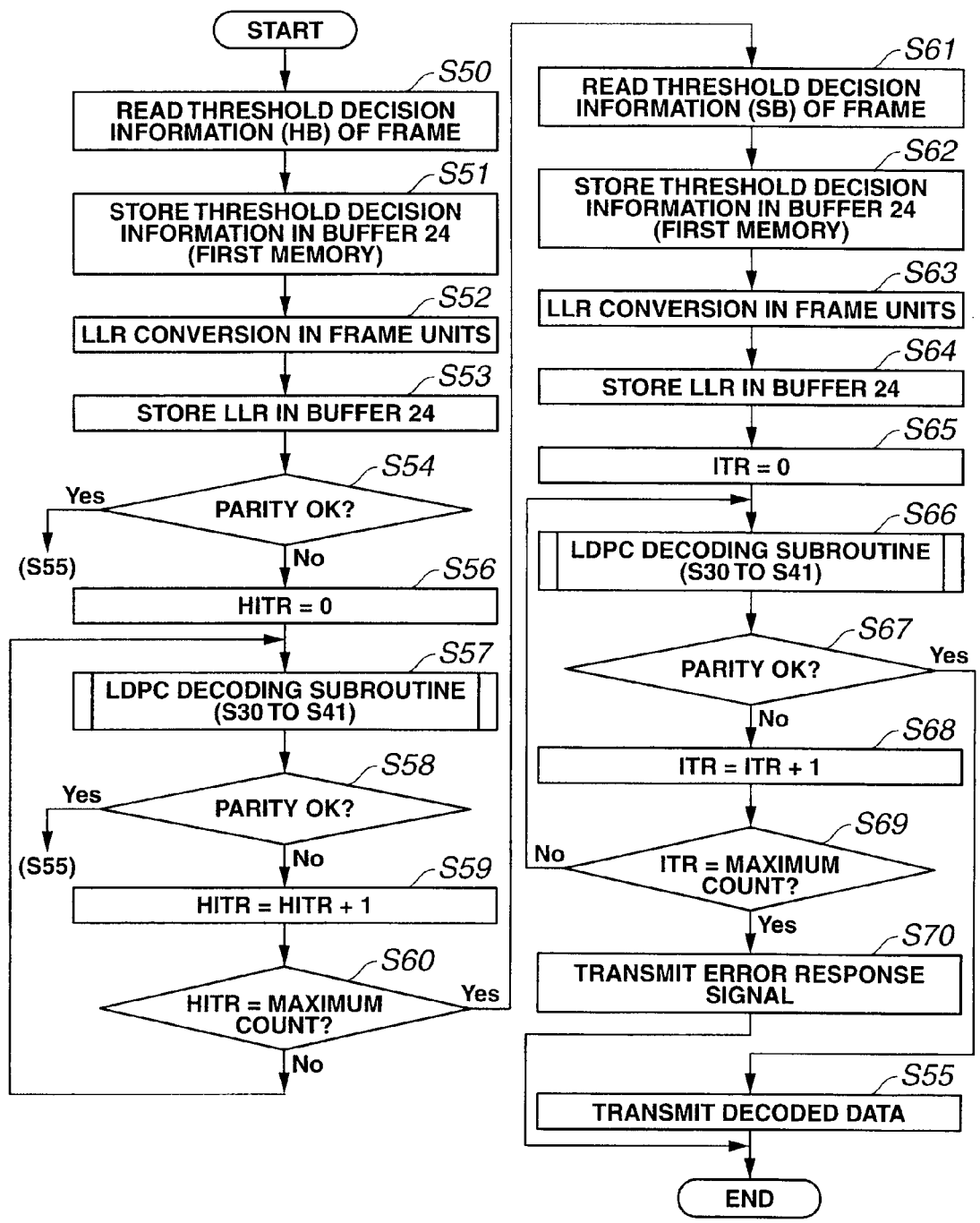
FIG. 12 is a flowchart illustrating a flow of memory card decoding according to the third embodiment.

Hereinafter, the present embodiment will be described according to a flowchart in FIG. 12.

<Step S50> HB Reading

The memory controller 3 receives threshold decision information made up of only the HB of frame-unit data from the memory section 5. Voltages applied to respective memory cells for reading are seven types of V32, V27, V22, V17, V12, V07 and V02, fewer than 35 types to read the SB. For this reason, processing is faster for reading only the HB than reading the SBs.

<Step S51 to Step S60>

This is processing similar to that in step S11 to step S19 of the first embodiment. However, the LLR conversion processing in step S52 is LLR conversion processing based on only the HB.

That is, the HB basically only indicates that data stored is any one of "0" and "1." However, the respective HBs have different voltages, and have therefore different levels of likelihood depending on the reading voltage. For example, an HB (111) having the lowest reading voltage stored in an Er state and an HB (011) having the highest reading voltage stored in a G state shown in FIG. 11 have higher reliability than other HBs.

An HB-LLR table for LLR conversion based on only the HB is prepared beforehand aside from the LLR table for LLR conversion based on the SBs. The LLR conversion based on only the HB is "considerably coarser" than LLR conversion using the SBs.

<Step S61>

When the iteration count HITR cannot perform decoding using an LLR converted from only the HB even after performing the decoding a predetermined maximum number of times (S60: Yes), the memory controller 3 receives threshold decision information made up of frame-unit data HB and SB from the memory section 5. Since the HBs are read in step S50, only the SBs may be read.

SB-LLR conversion processing is then performed using the LLR table shown in FIG. 11.

<Step S62 to Step S70, S55>

This is processing substantially the same as that in step S11 to step S20 and S17 of the first embodiment.

The memory controller 3B and the memory card 2B having the memory controller 3B have the effects of the memory card 2 or the like of the first embodiment, further allow decoding by only the HB and thereby provide a higher decoding speed.

A case has been described above where only the HB is read first, an LLR is calculated from only the HB to perform LDPC decoding and the HB and three types of SBs are read to perform LDPC decoding when decoding is not possible. By contrast, it is also possible to read only the HB to perform LDPC decoding, read the HB and one type of SB to perform LDPC decoding when decoding is not possible, read the HB and two types of SB to perform LDPC decoding when decoding is not possible and read the HB and three types of SBs to perform LDPC decoding when decoding is still not possible.

There are various schemes as modification examples of the above scheme, such as reading the HB and one type of SB first and reading the HB and three types of SBs next.

That is, the decoding method of the present embodiment is a decoding method of the first embodiment as follows.

A decoding method for frame-unit data coded using a low density parity code, including:

first-reading at least hard bit information as threshold decision information of the data from a NAND type flash memory section;

first-LLR-converting the first threshold decision information read in the first reading to a first logarithmic likelihood ratio;

performing first decoding, that is, soft decision decoding using the first logarithmic likelihood ratio converted in the first LLR conversion;

second-reading, when the first decoding is not possible, more soft bit information than the first reading as second threshold decision information of the data from the NAND type flash memory section;

second-LLR-converting the second threshold decision information read in the second reading to a second logarithmic likelihood ratio; and performing second decoding, that is, soft decision decoding using the second logarithmic likelihood ratio converted in the second LLR conversion.

<Supplementary Description>

Although a scheme (successive scheme) of performing LLR conversion processing in frame units has been described in step S12 shown in FIG. 9, a method (batch scheme) of performing LLR conversion processing in block units or divided block units may also be used. In this case, partial (block-unit or divided block-unit) data of a frame to be decoded read from the buffer 24 is converted to LLR data by the LLR conversion section 16 and stored in the LMEM 12.

The operation section 13 performs decoding using the LLR data stored in the LMEM 12. When the decoding with the LLR data stored in the LMEM 12 is completed, data necessary for the next processing is read from the buffer 24 and processed in the same way as for the first data. This processing is repeated to complete the decoding of 1-frame data.

The size of data read from the buffer 24 is related to the size of data subjected to parallel processing by the operation section 13. When, for example, the data is processed in block units, the data size is a size corresponds to one block. Thus, even the batch scheme, as in the case of the successive scheme, can execute similar processing using the LMEM having a much smaller capacity than that of the LMEM configured to store LLR data corresponding to one frame in the comparative example.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory controller comprising:

a first memory section configured to store threshold decision information of data read from a NAND type flash memory section when frame-unit data coded using a low density parity code is decoded through partial parallel processing based on a check matrix comprising a block of a unit matrix and a plurality of blocks in which each row of the unit matrix is sequentially shifted;

an LLR conversion section configured to convert the threshold decision information to a logarithmic likelihood ratio;

a second memory section configured to store probability information calculated during iteration processing that repeatedly performs column processing and row processing based on the logarithmic likelihood ratio in an iteration unit equal to or smaller than a size of the block; and a control section configured to transfer the probability information stored in the second memory section to the first memory section every time the iteration processing in the iteration unit is completed.

2. The memory controller according to claim 1, wherein the control section transfers the logarithmic likelihood ratio converted by the LLR conversion section to the same address of the first memory section at which the threshold decision information of one of the iteration unit is stored, and further transfers the logarithmic likelihood ratio stored in the first memory section to the second memory section in the iteration unit during the iteration processing.

3. The memory controller according to claim 2, wherein the control section transfers the probability information in one of the iteration unit calculated through the iteration processing to the same address of the first memory section at which the threshold decision information of the one iteration unit is stored.

4. The memory controller according to claim 3, wherein the iteration unit is the size of the block.

5. The memory controller according to claim 3, wherein the iteration unit is a divided block unit resulting from dividing the block unit by Z (Z is a natural number equal to or greater than 2).

6. A semiconductor memory apparatus comprising:

a NAND type flash memory section; and a memory controller comprising a first memory section configured to store threshold decision information of data read from the NAND type flash memory section when frame-unit data coded using a low density parity code is decoded through partial parallel processing based on a check matrix comprising a block of a unit matrix and a plurality of blocks in which each row of the unit matrix is sequentially shifted, an LLR conversion section configured to convert the threshold decision information to a logarithmic likelihood ratio, a second memory section configured to store probability information calculated during iteration processing that repeatedly performs column processing and row processing based on the logarithmic likelihood ratio in an iteration unit equal to or smaller than a size of the block, and a control section configured to transfer the probability information stored in the second memory section to the first memory section every time the iteration processing in the iteration unit is completed.

7. The semiconductor memory apparatus according to claim 6, wherein the control section transfers the logarithmic likelihood ratio converted by the LLR conversion section to the same address of the first memory section at which the threshold decision information of one of the iteration unit is stored, and further transfers the logarithmic likelihood ratio stored in the first memory section to the second memory section in the iteration unit during the iteration processing.

8. The semiconductor memory apparatus according to claim 7, wherein the control section transfers the probability information in one of the iteration unit calculated through the iteration processing to the same address of the first memory section at which the threshold decision information of the one iteration unit is stored.

9. The semiconductor memory apparatus according to claim 8, wherein the iteration unit is the size of the block.

10. The semiconductor memory apparatus according to claim 8, wherein the iteration unit is a divided block unit resulting from dividing the block unit by Z (Z is a natural number equal to or greater than 2).

11. A method of decoding frame-unit data coded using a low density parity code, comprising:
    storing threshold decision information of data read from a NAND type flash memory section in a first memory section when decoding is performed through partial parallel processing based on a check matrix comprising a block of a unit matrix and a plurality of blocks in which each row of the unit matrix is sequentially shifted;
    converting the threshold decision information to a logarithmic likelihood ratio;
    storing probability information calculated during iteration processing that repeatedly performs column processing and row processing based on the logarithmic likelihood ratio in an iteration unit equal to or smaller than a size of the block in a second memory section;
    transferring the probability information stored in the second memory section to the first memory section every time the iteration processing in the iteration unit is completed; and
    performing a parity check based on a temporary estimated word calculated from the probability information.

12. The decoding method according to claim 11, further comprising:
    transferring the converted logarithmic likelihood ratio to the same address at which the threshold decision information of one of the iteration unit is stored, and
    further transferring the logarithmic likelihood ratio stored in the first memory section to the second memory section in the iteration unit during the iteration processing.

13. The decoding method according to claim 12, wherein when the logarithmic likelihood ratio is transferred to the first memory section, the probability information calculated through the iteration processing of one of the iteration unit is transferred to the same address of the first memory section at which the threshold decision information of the one iteration unit is stored.

14. The decoding method according to claim 12, wherein the iteration unit is a divided block unit resulting from dividing the block unit by Z (Z is a natural number equal to or greater than 2).

15. The decoding method according to claim 12, further comprising:
    first-reading at least hard bit information as threshold decision information of the data from the NAND type flash memory section;
    first-LLR-converting the first threshold decision information read in the first reading to a first logarithmic likelihood ratio;
    performing first decoding, that is, soft decision decoding using the first logarithmic likelihood ratio converted in the first LLR conversion;
    second-reading, when the first decoding is not possible, more soft bit information than the first reading as second threshold decision information of the data from the NAND type flash memory section;
    second-LLR-converting the second threshold decision information read in the second reading to a second logarithmic likelihood ratio; and
    performing second decoding, that is, soft decision decoding using the second logarithmic likelihood ratio converted in the second LLR conversion.

16. The decoding method according to claim 12, wherein only hard bit information is read in the first reading.

* * * * *